US011428667B2

(12) United States Patent
Caciu (10) Patent No.: US 11,428,667 B2
(45) Date of Patent: Aug. 30, 2022

(54) MEASURING DEVICE COMPRISING A MAGNETIC FIELD GENERATOR AND ASSOCIATED MEASUREMENT METHOD

(71) Applicant: MAGNISENSE SE, Paris (FR)

(72) Inventor: Costin Caciu, Lyons (FR)

(73) Assignee: OVVI DIAGNOSTICS SE, Dardilly (FR)

( * ) Notice: Subject to any disclaimer, the term of this patent is extended or adjusted under 35 U.S.C. 154(b) by 0 days.

(21) Appl. No.: 17/012,971

(22) Filed: Sep. 4, 2020

(65) Prior Publication Data

US 2021/0072184 A1 Mar. 11, 2021

(30) Foreign Application Priority Data

Sep. 6, 2019 (FR) ...................................... 1909845

(51) Int. Cl.
*G01N 27/74* (2006.01)
(52) U.S. Cl.
CPC .................................. *G01N 27/74* (2013.01)
(58) Field of Classification Search
CPC ............... G01N 27/74; G01N 15/0656; G01N 33/2858; G01N 27/023; G01R 33/1269; G01R 33/0023; G01R 33/0035; G01R 33/12
See application file for complete search history.

(56) References Cited

U.S. PATENT DOCUMENTS

| 8,865,068 B2 | 10/2014 | Nikitin et al. |
| 2009/0051350 A1* | 2/2009 | Becker ............... G01N 15/0656 324/204 |
| 2009/0164161 A1* | 6/2009 | Hong ................. G01N 33/5302 702/75 |
| 2013/0157256 A1 | 6/2013 | Rueckert et al. |

OTHER PUBLICATIONS

Preliminary Search Report for FR 1909845, dated May 15, 2020.

* cited by examiner

*Primary Examiner* — Jermele M Hollington
*Assistant Examiner* — Suresh K Rajaputra
(74) *Attorney, Agent, or Firm* — B. Aaron Schulman, Esq.; Stites & Harbison, PLLC (57) ABSTRACT

The invention relates to a device for measuring a first parameter of a specimen, the device including a measuring volume configured to receive the specimen, a first control module and a measuring module, the first control module being configured to supply electricity to the measuring module with an electrical supply current, the measuring module including a magnetic field generator, a sensor and a second control module, the magnetic field generator being configured to generate a magnetic field in the measuring volume, the sensor being configured to measure values of a variable of the measuring volume during the generation of the magnetic field, the second measuring control module being configured to calculate a value of the parameter based on at least one value of the variable.

(Continued)

The first control module is configured in order, following the generation of the magnetic field, to inhibit the power supply of the measuring module during a first predetermined length of time (dn).

11 Claims, 5 Drawing Sheets

MEASURING DEVICE COMPRISING A MAGNETIC FIELD GENERATOR AND ASSOCIATED MEASUREMENT METHOD

FIELD OF THE INVENTION

The present invention relates to a device for measuring a first parameter of a specimen. The present invention also relates to a measuring method implemented by such a device.

BACKGROUND OF THE INVENTION

Devices provided to measure parameters of a specimen, for example the concentration in certain species of a liquid, using a magnetic field are used in many applications, in particular relative to medicine. For example, it is known to measure concentrations of different analytes such as enzymes, antibodies, ions, proteins or microorganisms in a specimen of bodily fluid, in particular blood.

To that end, the specimen is inserted into a chamber provided to that end, in which a magnetic field is generated, for example a direct or alternating magnetic field. The presence of this magnetic field generates a response by the specimen, which in particular takes the form of a modification of the magnetic field. One or several values of a variable of the chamber, in particular a variable depending on the magnetic field present in the chamber, are acquired by a sensor to that effect in the presence of the magnetic field, a calculating module then determining one or several values of the parameter based on the measured values.

Such measuring devices have a very high sensitivity, in particular making it possible to measure very low values of the targeted parameter, in particular to detect very low concentrations of the analyte(s) in the specimen.

However, the generation of the magnetic field and its measurement are sensitive to the temperature of the magnetic field generator and the magnetic field sensor, and in particular the electronic boards that they contain. In particular, when the temperature of these elements is not constant, the sensitivity of the measurements decreases drastically.

This is problematic because during their operation, the generator, the sensor and the computing module naturally dissipate heat. As a result, when the measuring device is turned on after a significant resting time, for example when the measuring device has been turned off for the night, the temperatures of the generator, the sensor and the calculating module increase gradually over a time range that may reach several tens of minutes, or even more than an hour, before stabilizing. Thus, it is possible to perform measurements with an acceptable precision during a short initial period during which the measuring device is still cold, then after stabilization of the temperature, but not during the long time range where the temperature is increasing. As a result, the measuring device is frequently unavailable during significant time ranges, whereas it could be necessary to take measurements during these time ranges.

SUMMARY OF THE INVENTION

There is therefore a need for a device for measuring a parameter of a specimen via an excitation of the specimen by a magnetic field, which has a better availability than the measuring devices of the state of the art, while preserving a good sensitivity.

To that end, a device is proposed for measuring a first parameter of a specimen, the device including a measuring volume configured to receive the specimen, a first control module and a measuring module, the first control module being configured to supply electricity to the measuring module with an electrical supply current, the measuring module including a magnetic field generator, a sensor and a second control module, the magnetic field generator being configured to generate a magnetic excitation field in the measuring volume, the sensor being configured to measure values of a variable of the measuring volume during the generation of the magnetic excitation field, the second measuring control module being configured to calculate a value of the first parameter based on at least one value of the variable, the variable in particular being an intensity of the magnetic field in the measuring volume, the first control module being configured in order, following the generation of the magnetic excitation field, to inhibit the power supply of the measuring module during a first predetermined length of time.

According to specific embodiments, the measuring device includes one or more of the following features, considered alone or according to all technically possible combinations:

- the first length of time is inclusively between 4 minutes and 6 minutes.
- the measuring device further includes a detector able to detect the presence of a specimen in the measuring volume, the first control module being configured in order, following the detection of the presence of a specimen in the measuring volume, to supply electricity to the measuring module at the end of a second predetermined length of time, the supply being inhibited as long as a third length of time, measured from the last generation of a magnetic excitation field by the measuring device, is less than or equal to the first length of time.
- the first control module is configured in order, when no specimen is present in the measuring volume, to supply electricity to the measuring module during a series of time ranges, the generator generating the magnetic excitation field during each time range, the time ranges being repeated periodically with a predetermined time period greater than or equal to the first duration, the second control module being configured to calculate, for each time range, an initial value of a second parameter of the measurement volume from at least one value of the variable measured during the time range, the values of the first parameter being calculated based on at least one calculated initial value.
- the measuring device further includes an incubation chamber configured to receive the specimen and to keep the specimen at a predetermined temperature, the first control module being configured to:
  detect an insertion of the specimen into the incubation chamber at an insertion instant,
  estimate an end of incubation instant, after the insertion instant and separated from the insertion instant by a predetermined incubation duration, and
  inhibit the supply of the measuring module during each time range prior to the end of incubation instant and separated from the end of incubation instant by a length of time less than or equal to the first duration.
- the magnetic excitation field includes at least two first frequency components, each frequency component having a first frequency separate from the first frequency of the other frequency component, the sensor being configured to measure values of a second frequency component of the variable, the second frequency component having a second frequency, the second frequency component being equal to the sum of two products, each product being the product of one of the two first frequencies and an integer different from zero.

A method is also proposed for measuring a first parameter of a specimen, implemented by a measuring device including a measuring volume, a first control module and a measuring module, the measuring module including a magnetic field generator, a sensor and a second control module, the method including the following steps:

supplying the measuring module with an electric supply current via the first control module, generating, via the magnetic field generator, a magnetic excitation field in the measuring volume, the specimen being received in the measuring volume, measuring, via the sensor when the magnetic excitation field is generated, values of a variable of the measuring volume, the measured values being transmitted to the second control module, the variable in particular being an intensity of the magnetic field in the measuring volume, and calculating, via the second control module, a value of the first parameter based on at least one received value, the method further including, after the implementation of the generating step, a step for inhibiting, by the first control module, of the supply of the measuring module during a first predetermined length of time.

According to specific embodiments, the method includes one or more of the following features, considered alone or according to any technically possible combinations:

the method includes the following steps:
when no specimen is present in the measuring volume, supplying electricity to the measuring module during a plurality of time ranges via the first control module, the time ranges being repeated periodically with a predetermined time period greater than or equal to the first duration, generating the magnetic excitation field via the generator and measuring, via the sensor, at least one value of the variable during each time range, and determining, via the second control module, for each time range, an initial value of a second parameter of the measuring volume from the value(s) of the variable measured during the time range, each value of the first parameter being calculated by the second control module based on at least one determined initial value.

the method successively includes the following steps, in this order:
storing each initial value in a memory of the measuring device,
turning off the measuring device,
turning on the measuring device,
for a single time range, after the turning on step, generating the magnetic excitation field via the generator, measuring, via the sensor, at least one value of the variable during the time range, and determining, via the second control module, an initial value of a second parameter of the measuring volume from the value(s) of the variable measured during said time range,
comparing the initial value determined during the time range after the turning on step and the initial value determined during the last determining step implemented before the turning off step, and
if a difference between the two compared initial values is less than or equal to a predetermined threshold, calculating at least one value of the first parameter based on one of the two compared initial values.

the magnetic excitation field includes at least two first frequency components, each frequency component having a first frequency separate from the first frequency of the other frequency component, the sensor being configured to measure values of a second frequency component of the variable, the second frequency component having a second frequency, the second frequency being equal to the sum of two products, each product being the product of one of the two first frequencies and an integer different from zero.

the first parameter is a concentration of elements-analytes in the specimen, the method including, prior to the generating, measuring and calculating steps, a step for placing the specimen in contact with a set of superparamagnetic particles, each particle being able to attach to the elements-analytes.

BRIEF DESCRIPTION OF DRAWINGS

Features and advantages of the invention will appear more clearly upon reading the following description, provided solely as a non-limiting example, and done in reference to the appended drawings, in which.

DETAILED DESCRIPTION OF PREFERRED EMBODIMENTS

Figure 1:
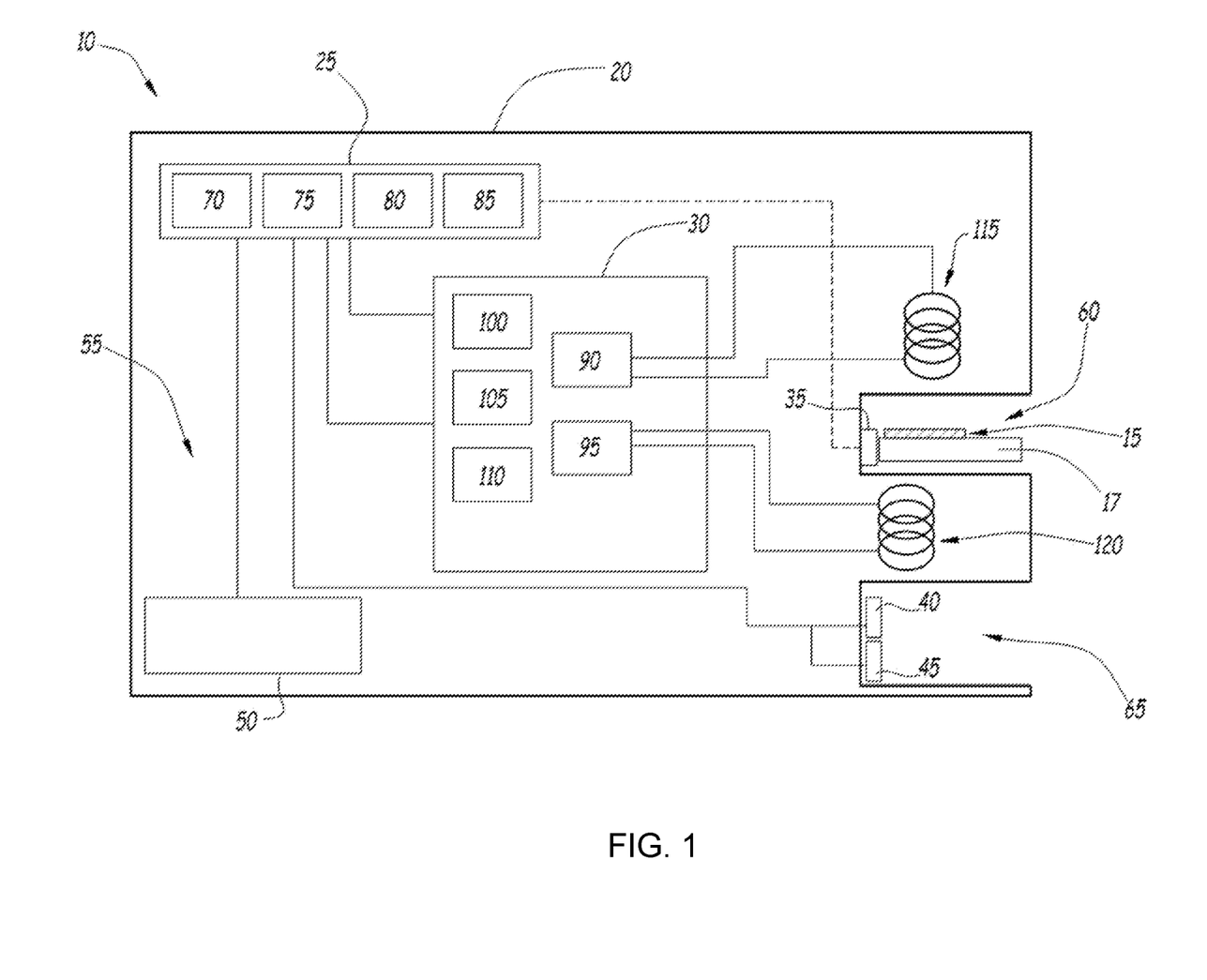
FIG. 1 is a schematic illustration of a device for measuring a first parameter of a specimen.

The device 10 for measuring a first parameter of a specimen 15 is shown in FIG. 1.

The device 10 includes a housing 20, a first control module 25, a measuring module 30, a first detector 35, a second detector 40, a regulating module 45 and a man-machine interface 50.

The specimen 15 for example includes a fluid, in particular a bodily fluid such as blood or lymph.

However, many variants in which the fluid is not a bodily fluid can be considered.

The first parameter is in particular a concentration of elements-analytes in the specimen 15, in particular in the fluid.

Each element-analyte is for example an ion, a microorganism, a protein, an enzyme, an antibody or an antigen. However, other examples of elements-analytes can also be considered.

According to one embodiment, the fluid includes, in addition to the elements-analytes, a set of superparamagnetic particles.

Superparamagnetism is the property of certain materials, in particular certain ferromagnetic or ferrimagnetic particles, by which the magnetization of the particles is nil in the absence of an outside magnetic field, but may be very high in the presence of such a magnetic field.

Each particle is made from a ferromagnetic or ferrimagnetic material, such as $Fe_2O_3$ or $Fe_3O_4$.

Each particle has a maximum size, in particular a diameter, inclusively between 150 nanometers (nm) and 250 nm.

Each particle is able to attach to one or several elements-analytes. For example, each particle is functionalized with a set of components bonded to the surface of the molecule and able to attach to one or several elements-analytes.

The particles are preferably as described in application EP 1,262,766, which is incorporated here by reference.

The fluid is for example received in a container, or in particular borne in a known manner by a test strip 17.

The housing 20 delimits a main chamber 55, a measuring chamber 60 and an incubation chamber 65. The housing 20 is configured to insulate the main chamber 55, the measuring chamber 60 and the incubation chamber 65 from one another.

The housing 20 is further configured to insulate the main chamber 55, the measuring chamber 60 and the incubation chamber 65 from the outside of the housing 20.

The main chamber 55 for example receives the first control module 25, and at least partially receives the measuring module 30.

The measuring chamber 60 is configured to receive the specimen 15. As will appear later, the measuring chamber 60 forms a measuring volume in that the measuring device 10 is configured to measure a first parameter of the specimen 15 when the specimen 15 is received in the measuring chamber 60.

It should be noted that according to possible variants, the measuring volume is not formed by a chamber arranged in the housing 20, but for example by a zone outside the housing 20, the measuring device 20 being provided to measure the first parameter when the specimen 15 is arranged in this zone.

The incubation chamber 65 is configured to receive the specimen 15.

The first control module 25 includes a first management module 70, a second management module 75, a first memory 80 and a first processor 85.

As shown in FIG. 1, the first management module 70 and the second management module 75 are each made in the form of software, or a software component, executable by the first processor 85. The first memory 80 is then able to store the first management software and second management software. The first processor 85 is then able to execute each piece of software.

In a variant that is not shown, the first management module 70 and the second management module 75 are each made in the form of a programmable logic component, such as an FPGA (Field Programmable Gate Array), or in the form of a dedicated integrated circuit, such as an ASIC (Application-Specific Integrated Circuit).

When the first management module 70 and the second management module 75 are made in the form of one or several pieces of software, that is to say in the form of a computer program, they are further able to be recorded on a computer-readable medium, not shown. The computer-readable medium is for example a medium suitable for storing electronic instructions and able to be coupled with a bus of a computer system. As an example, the readable medium is an optical disc, a magnetic-optical disc, a ROM memory, a RAM memory, any type of non-volatile memory (for example, EPROM, EEPROM, FLASH, NVRAM), a magnetic card or an optical card. A computer program including software instructions is then stored on the readable medium.

The first management module 70 is configured to supply electricity to the measuring module 30 with an electrical supply current.

The electrical supply current is for example a DC current. In a variant, the electrical supply current is an AC current.

The first management module 70 is further configured to exchange information with the measuring module 30.

The second management module 75 is configured to command the transmission of information between the first control module 25 and the man-machine interface 50.

The measuring module 30 is configured to measure the first parameter of the specimen 15 when the specimen 15 is received in the measuring chamber 60.

The measuring module 30 is provided to be supplied with electricity by the electrical supply current. In particular, the measuring module 30 is devoid of electricity and electrical energy storage means, such that the measuring module 30 cannot operate without the electrical supply current.

The measuring module 30 includes a magnetic field generator 90, a sensor 95, a second control module 100, a second memory 105 and a second processor 110. The magnetic field generator 90 is configured to generate a magnetic excitation field in the measuring volume.

For example, the magnetic field generator 90 is configured to generate the magnetic excitation field systematically when the measuring module 30 is electrically supplied. Thus, in the remainder of the disclosure, the mention of a time instant or a length of time where the electrical supply of this measuring module 30 takes place and the mention of a time instant or a length of time where the magnetic excitation field is generated are interchangeable.

The magnetic excitation field is in particular a variable magnetic field. It should be noted that the intensity of the magnetic excitation field may vary.

For example, the magnetic excitation field has at least one first frequency component, in particular two first frequency components that are different from one another.

Each first frequency component has a first frequency $f1$, $f1'$.

The first frequencies $f1$, $f1'$ of the first two frequency components are different from one another.

For example, one of the first frequencies $f1$ is equal to 100 Hertz (Hz), the other first frequency $f1'$ being equal to 100 kiloHertz (kHz).

The magnetic field generator 90 for example includes a first electrically conductive winding 115. The first winding 115 is configured to generate the magnetic excitation field inside the measuring volume when an electrical generating current circulates in the first winding 115.

The first winding 115 is for example arranged in the measuring chamber 60. In a variant, the first winding 115 is arranged outside the measuring chamber 60.

The electrical generating current is for example an electric current generated by the second control module 100 and having, for each first frequency component, a second frequency component having a frequency equal to the first frequency $f1$, $f1'$ of the considered first frequency component.

The sensor 95 is configured to measure values of a variable of the measuring volume.

The variable is in particular a magnetic field value inside the measuring volume. In a variant, the variable is a magnetic field value near the measuring volume.

The sensor 95 is configured to deduce values of the measured variable from the values of a second component of the magnetic field. The second component has a second frequency $f2$.

The second frequency f2 is equal to the sum of two products.

Each product is the product of one of the two first frequencies f1, f1' and an integer different from zero.

For example, the sensor 95 includes a second winding 120.

The second winding 120 is for example arranged in the measuring chamber 60. In a variant, as shown in FIG. 1, the second winding 120 is arranged outside the measuring chamber 60.

The sensor 95 is for example configured to measure a current generated in the second winding 120 by the magnetic field. In particular, the sensor 95 is configured to measure an intensity of a third component of the current having the second frequency f2, this intensity being representative of the intensity of the second component of the magnetic field.

For example, the sensor 95 is configured to deduce the intensity of the third component of the measured intensity values, in particular through a frequency analysis of the measured values. Such a frequency analysis for example includes calculating coefficients of a Fourier transform of the measured intensity values.

The second control module 100 is configured to calculate at least one value of the first parameter based on the values of the variable measured by the sensor 95. For example, the second control module 100 is configured to calculate at least one value of the first parameter based on the intensity values of the third component. According to one embodiment, the second control module 100 is configured to calculate the value(s) of the first parameter as described in patent EP 1,262,766.

The second control module 100 is further configured to calculate each value of the first parameter based on values measured by the sensor 95 and at least one value, called "initial value", of a second parameter.

The second parameter is for example a value of the variable when no particle is present in the measuring chamber 60. During the calculation of the first parameter, the second parameter is subtracted from the measured values of the variable in order to obtain corrected values, the first parameter being calculated from the corrected values.

The second control module 100 is further configured to transmit the calculated values to the first control module 25.

The second control module 100 is in the form of software, or a software component, executable by the second processor 110 and stored in the second memory 105.

In a variant, the second control module 100 is made in the form of a programmable logic component, such as an FPGA (Field Programmable Gate Array), or in the form of a dedicated integrated circuit, such as an ASIC (Application-Specific Integrated Circuit).

When the second control module 100 is made in the form of one or several software programs, i.e., in the form of a computer program, it is further able to be stored on a computer-readable medium.

The first detector 35 is configured to detect the presence of the specimen 15 in the measuring volume, in particular in the measuring chamber 60.

The first detector 35 for example includes a button actuated by the specimen 15, for example by the strip 17 or by a cassette in which the strip 17 is inserted, when the specimen 15 is received in the measuring chamber 60. However, other types of first detectors 35 may also be considered.

The first detector 35 is configured to transmit a first detection signal to the first control module 25 when the first detector 35 detects the presence of the specimen 15 in the measuring volume.

The second detector 40 is configured to detect the presence of the specimen 15 in the measuring volume, in particular in the incubation chamber 65.

The second detector 40 for example includes a button actuated by the specimen 15, for example by the strip 17 or by a shell in which the strip is inserted, when the specimen 15 is received in the incubation chamber 65. However, other types of second detectors 40 may also be considered.

The second detector 40 is configured to transmit a second detection signal to the second control module 25 when the first detector 40 detects the presence of the specimen 15 in the incubation chamber 65.

In a known manner, the regulating module 45 is configured to keep the specimen 15 at a predetermined temperature, for example inclusively between 18 degrees Celsius (° C.) and 25° C. when the specimen 15 is received in the incubation chamber 65.

Figure 2:
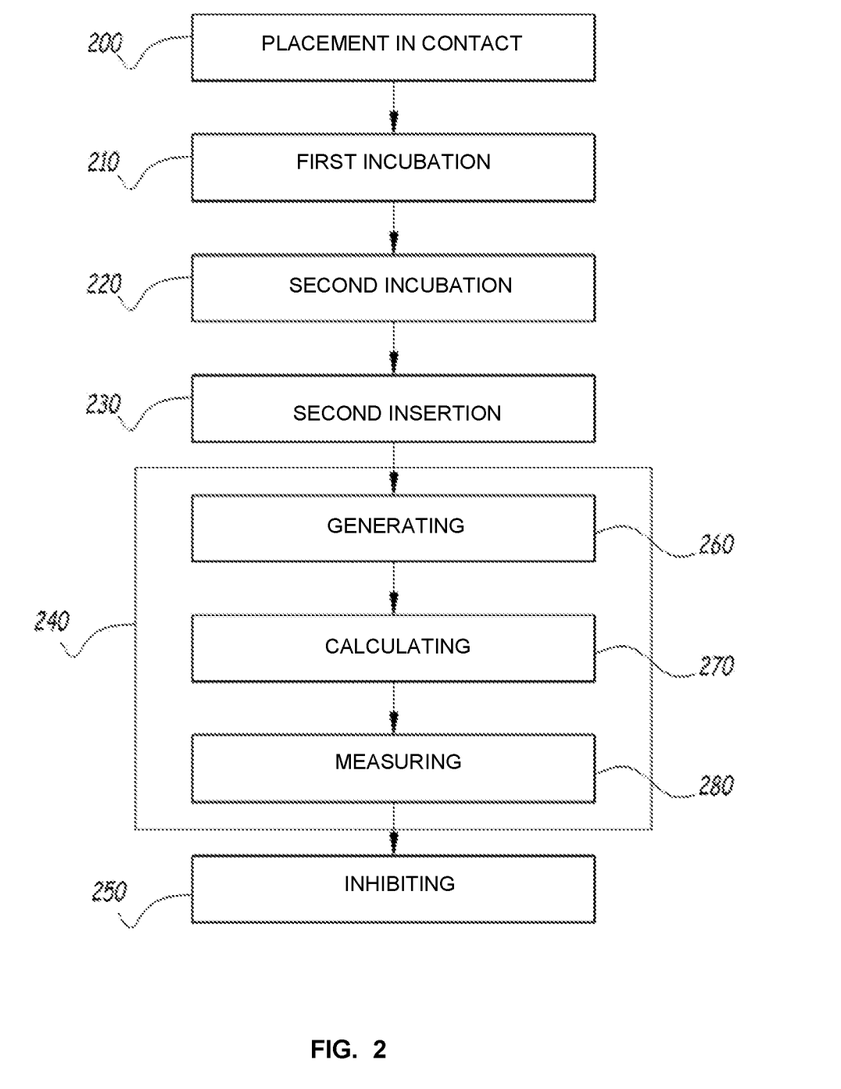
FIG. 2 is a flowchart of steps of a first exemplary method for measuring the first parameter implemented by the measuring device of FIG. 1.

A first exemplary method for measuring the first parameter of a specimen 15 will now be described in reference to FIG. 2, which is a flowchart of the steps of the first exemplary method.

Figure 3:
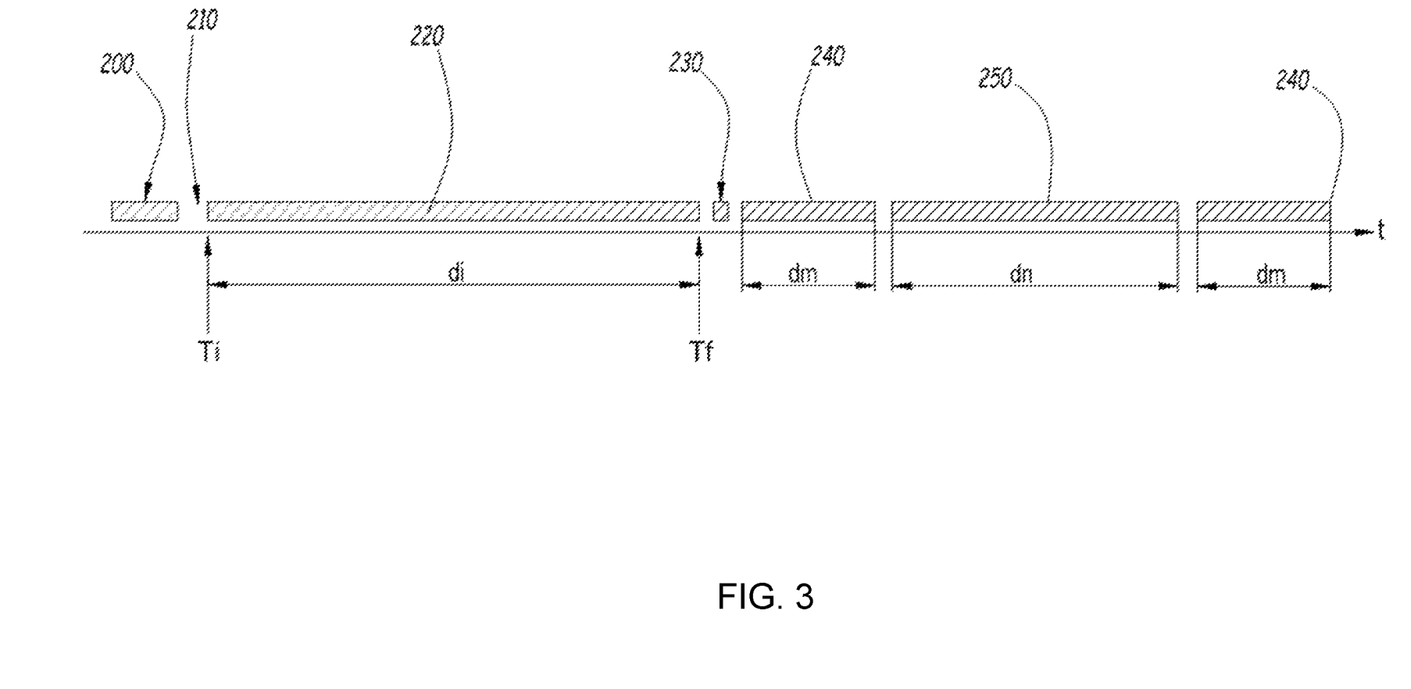
FIG. 3 is a historical timeline showing the different steps of the first exemplary method.

Furthermore, a time axis t is shown in FIG. 3. The different steps, and in particular their durations, are indicated on the time axis t.

The first exemplary measuring method is implemented by the measuring device 10.

The first example includes a step 200 for placement in contact, a first insertion step 210, an incubation step 220, a second insertion step 230, a measuring step 240 and an inhibiting step 250.

The step for placement in contact 200 includes, in a known manner, placing the fluid intended to be integrated into the specimen 15 in contact with a set of superparamagnetic particles.

This step for placement in contact is in particular as described in patent EP 1,262,766.

During the step for placement in contact, the particles are attached to the elements-analytes present in the specimen 15.

After the step for placement in contact, the specimen 15 is inserted into the incubation chamber 65 during the first incubation step 210.

The second detector 40 detects the presence of the specimen 15 in the incubation chamber 65 and therefore sends the second signal to the first control module 25.

The second signal is sent to the first control module 25 at an insertion instant Ti.

After the reception of the second signal, the first control module 25 estimates an end of incubation instant Tf.

The end of incubation instant T is separated from the insertion instant Ti by a predetermined length of time called incubation duration di.

During the incubation step 220, the specimen 15 is kept at a predetermined temperature in the incubation chamber 65 during at least the incubation duration di.

The incubation duration di is determined so as to allow the performance and stabilization of the reaction of the test. This incubation duration di may vary.

During the second insertion step 230, after the incubation step, the specimen 230 is removed from the incubation chamber 65 and inserted into the measuring chamber 60.

The first signal is then transmitted by the first detector 35 to the first control module 30.

After the first signal is received, the first control module 25 supplies the first measuring module 30, during the measuring step 240, with the electrical supply current.

For example, the measuring step 240 is implemented during a measuring time range having a predetermined measuring duration dm, the first control module 25 supplying the measuring module 30 with the electrical supply current during the measuring duration dm and stopping the supply when the measuring duration dm has elapsed.

During the step for placement in contact 200, the first insertion step 210, the incubation step 220 and the second insertion step 230, the first control module 25 for example does not supply the measuring module 30 with the electrical supply current.

During the measuring step 240, since the measuring module 30 is supplied with electricity, the measuring module 30 implements a generating step 260, a measuring step 270 and a calculating step 280.

During the generating step 260, the generator 90 generates the magnetic excitation field.

During the measuring step 270, while the magnetic excitation field is generated, the particles induce, in the magnetic excitation field, the appearance of the second frequency component.

At least one value of the variable, in particular at least one value of an intensity of the second frequency component, is then measured by the sensor 95.

For example, the magnetic excitation field generates the appearance of an electric current in the second winding 120, the second frequency component causing the appearance of the third frequency component in the generated electric current.

The sensor 95 for example deduces each intensity value of the second frequency component via a frequency analysis of values of the generated electric current, for example by a Fourier transform.

Each value of the measured variable is transmitted to the second control module 100.

During the calculating step 280, the second control module 100 calculates at least one value of the first parameter, for example as described in European patent No. 1,262,766.

Each value of the first parameter is transmitted to the first control module 25, which stores it for example in the first memory 80. Each value of the first parameter is for example displayed for an operator by the man-machine interface 50.

At the end of the measuring step 240, the inhibiting step 250 is carried out.

In particular, the inhibiting step is systematically implemented after any period of time during which the magnetic excitation field is generated, in particular after the implementation of each generating step 260.

For example, the inhibiting step 250 is systematically implemented when the measuring module 30 has been electrically supplied with the electrical supply current during a duration greater than or equal to a predetermined threshold.

The predetermined threshold is for example inclusively between 1 minute and 2 minutes.

The inhibiting step 250 includes the inhibition of the measuring module during a predetermined length of time, called inhibition duration dn.

The inhibition duration dn is inclusively between 4 minutes and 6 minutes. This duration makes it possible to maintain acceptable temperatures for the implementation of the biological test.

"Inhibition" means that the measuring module 30 is not electrically supplied by the first control module 25. In particular, even if a new specimen 15 is inserted into the measuring volume 60, or if an operator commands the implementation of a new measuring step 240 via the man-machine interface 50, the measuring module 30 is not electrically supplied.

At the end of the inhibition duration dn, a new measuring step 240 is for example implemented, as shown in FIG. 3, if a specimen 15 is present in the measuring volume 60. In particular, if a specimen 15 is inserted in the measuring volume 60 before the end of the inhibiting step 250, the measuring step 240 of this specimen 15 is implemented at the end of the inhibiting step 250, that is to say when the inhibition duration dn has elapsed since the end of the preceding measuring step 240.

Owing to the use of the inhibiting step, the measuring module 30 stays cold, since the measuring module 30 has time to cool down during the inhibiting step. Indeed, the measuring module 30 is generally responsible for the majority of the electrical consumption of the measuring device 10, in particular to generate the magnetic excitation field. The cutoff of the electrical supply of this measuring module 30 therefore greatly decreases the energy dissipation in the measuring device 10, and therefore the heat generation by the latter.

As a result, the sensitivity of the measuring device 10 remains substantially constant over time, and in particular does not go through a period during which it decreases drastically due to the temperature climb of the measuring module 30. The sensitivity therefore remains very good in a lasting manner.

To that end, an inhibition duration dn inclusively between 4 minutes and 6 minutes in particular allows the measuring module 30 to cool down effectively without excessively limiting the frequency at which measurements can be done.

It should be noted that different inhibition durations dn can be considered, depending on the design of the measuring module 30, for example shorter if the latter is well ventilated and can therefore cool down quickly or if the measuring module 30 consumes little energy and therefore does not heat up much.

According to a variant of the first example, the incubation step 220 is done in the measuring chamber 60. The first insertion step 210 is then not carried out, the second insertion step 230 being implemented before the incubation step 220. Furthermore, the regulating module 45 is configured to keep the temperature inside the measuring chamber 60 equal to the predetermined temperature.

For example, the first control module 25 is configured to electrically supply the measuring module 30, after the emission of the first signal by the first detector 35, at the end of a predetermined length of time, which is for example equal to the incubation duration di.

However, as long as a duration elapsed since the last instant where the generator 90 generated the magnetic excitation field is less than or equal to the inhibition duration, the electrical supply of the measuring module 30 is inhibited by the first control module. This variant has the advantage of being able to be implemented by a simpler measuring device 10, since it is not necessary to provide the incubation chamber 65.

A second exemplary measuring method implemented by the measuring device 10 will now be described in reference to FIG. 4. The elements identical to the first exemplary method are not described again. Only the differences are shown.

Figure 4:
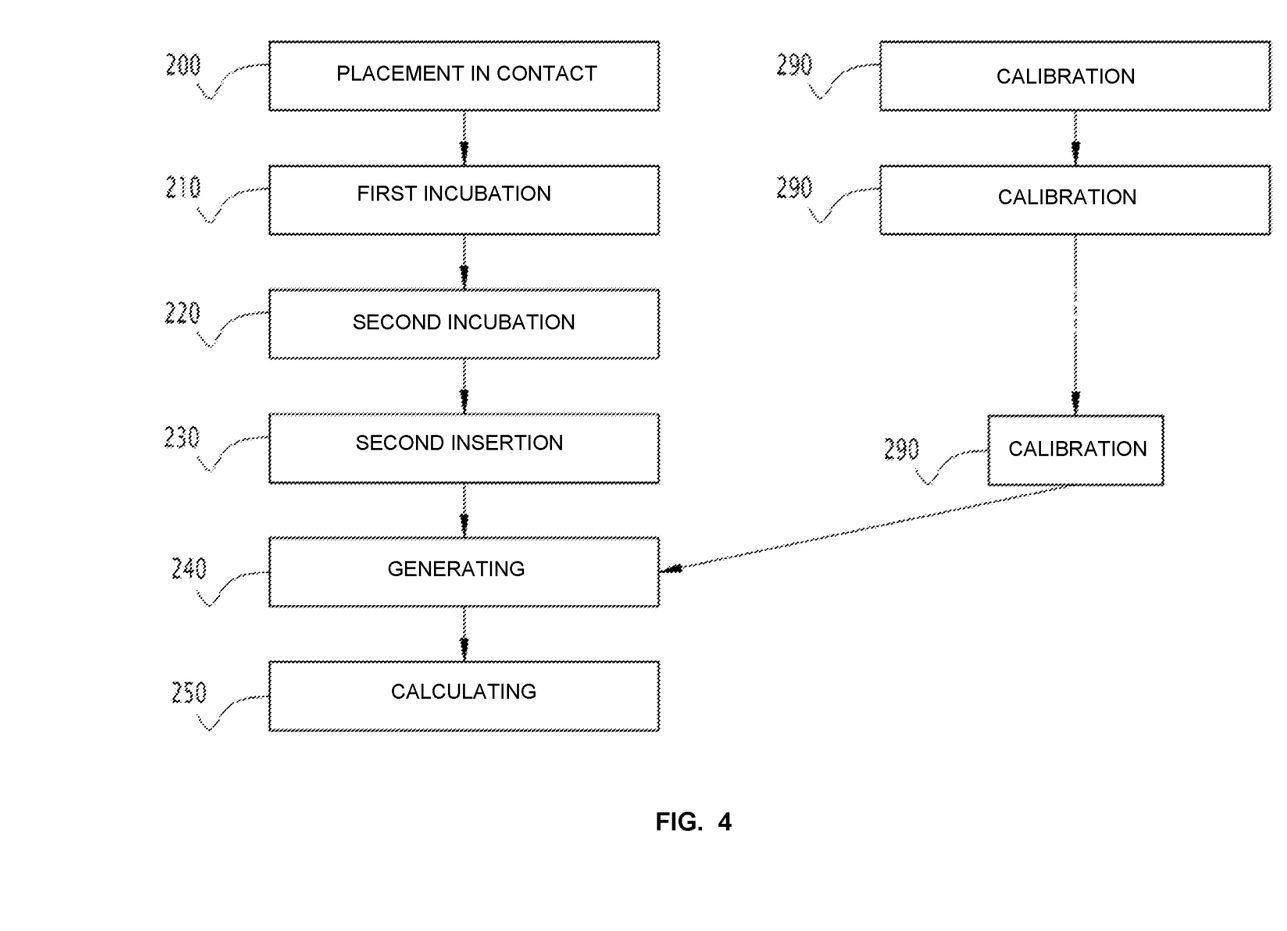
FIG. 4 is a flowchart of steps of a second exemplary method for measuring the first parameter implemented by the measuring device of FIG. 1.
Figure 5:
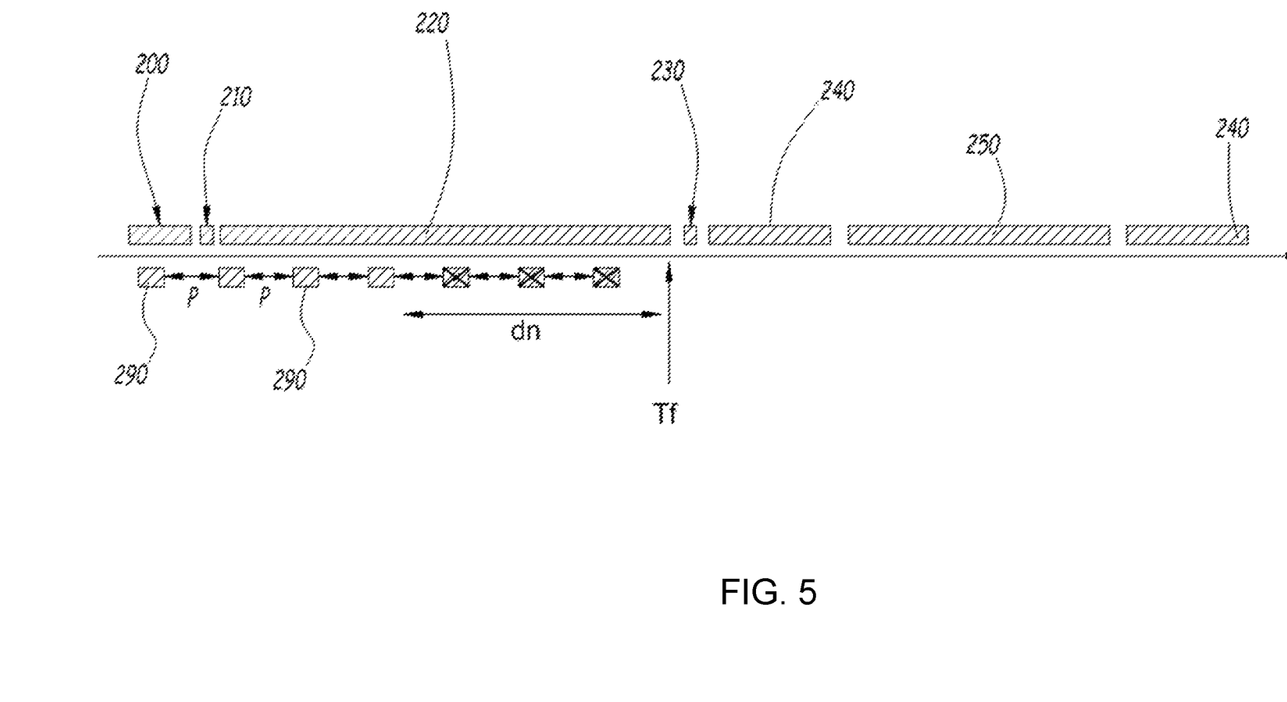
FIG. 5 is a historical timeline showing the different steps of the second exemplary method.

FIG. 4 shows a flowchart of the steps of the second exemplary method. Furthermore, FIG. 5 shows the sequence and the respective durations of the different steps of the second exemplary method.

In the second exemplary method, it is presumed that, during the step for placement in contact 200, the measuring device 10 is powered on by an operator. In particular, no specimen 15 is present in the measuring volume 60 before the second insertion step 230.

The second exemplary method includes a plurality of calibration steps 290.

Each calibration step 290 is implemented during a corresponding calibration time range. Each calibration time range has a calibration duration dc for example inclusively between 1 minute and 2 minutes.

The calibration time ranges are for example periodically repeated with a predetermined time period P.

The time period P is greater than or equal to the inhibition duration dn.

The time period P is for example inclusively between 4 minutes and 6 minutes.

During each calibration time range, no specimen 15 is received in the measuring volume 60.

For example, when the first detector 35 detects the absence of a specimen 15 in the measuring volume 60, the first control module 25 commands the implementation of a first calibration step 290, and commands the implementation of successive calibration steps 290 as long as the first detector 35 does not emit the first signal indicating the presence of a specimen 15 in the measuring volume 60.

In particular, at least one calibration step 290 is implemented during the incubation step 220 if no specimen 15 is present in the measuring volume 60.

In the second exemplary method, as shown in FIG. 4, a first calibration step 290 is implemented during step for placement in contact 200, since the measuring device 10 is powered on and no specimen 15 is present in the measuring volume 60.

The calibration steps 290 are next repeated periodically with the time period P. This is shown in FIG. 5 by a series of calibration steps 290 below the time axis t.

In particular, the calibration steps 290 are repeated periodically during the first insertion step 210 and during the incubation step 220.

During the calibration time range associated with each calibration step 290, the first control module 25 electrically supplies the measuring module 30.

However, each calibration step 290 prior to the end of incubation instant Tf and separated from the end of incubation instant Tf by a length of time less than or equal to the inhibition duration dn is inhibited. In other words, during each calibration time range prior to the end of incubation instant Tf and separated from the end of incubation instant Tf by a length of time less than or equal to the inhibition duration dn, the supply of the measuring module 30 is inhibited by the first control module 25.

Calibration time range "separated from the end of incubation instant Tf by a length of time less than or equal to the inhibition duration dn" refers to any calibration time range whereof at least one time instant, in particular the instant of the end of the calibration time range, is separated from the end of incubation instant Tf by a length of time less than or equal to the inhibition duration dn.

The calibration step 290 associated with each inhibited calibration time range is not implemented. This is shown in FIG. 5 by a plurality of calibration steps 290 crossed out by an X.

During each calibration step 290, since the measuring module 30 is electrically supplied, the generator 90 generates the magnetic excitation field.

Furthermore, the sensor 95 measures values of the variable during the calibration step 290.

From the values measured during the calibration step 290, the second control module 100 calculates an initial value of the second parameter.

For example, the initial value is an average value of the values measured during the calibration step 290.

During each calibration step 290, the initial value of the second calculated parameter is stored in the second memory 105.

During each calculating step 280, each value of the first parameter is calculated based on at least one initial value of the second parameter stored in the second memory 105, in particular the initial value stored during the last calibration step 290 implemented.

In a variant, during the calculating step 280, each value of the first parameter is calculated from an average value of the initial values calculated during a plurality of successive calibration steps 290. For example, the average value is an average value of the initial values calculated during the 8 last calibration steps 290 implemented.

Owing to the use of periodic calibration steps 290, any evolution of the measuring device 10, in particular any contamination by elements that may affect the measurement of the first parameter, is detected automatically and taken into account during the following measurement of the first parameter. The precision of the measurement is therefore improved.

Furthermore, the inhibition of each calibration step 290 separated from the end of incubation instant Tf by a duration less than or equal to the inhibition duration dn makes it possible to ensure that the implementation of the calibration steps 290 does not delay the implementation of the measuring step 240. Indeed, otherwise, it would be necessary to wait, from the insertion 230 of the specimen 15 into the measuring volume 60 and therefore the cessation of the calibration steps 290, at least for the inhibition duration dn before being able to perform the measurement 240.

This results in better availability of the measuring device 10, in particular by ensuring the ability to perform measurements once the specimen 15 has finished its incubation.

According to one variant of the second exemplary method, when the measuring device is turned off, then turned back on, the following steps are implemented in the following order:

storing each initial value in the first or second memory 80, 105, for example each calculated initial value is stored during the calibration step 290 during which it was calculated;

turning off the measuring device 10, for example one evening, the turning off step including cutting the electrical supply of the first control module 25 and the measuring module 30, turning on the measuring device 10, for example the following morning or several days later, although the duration between the turning off and turning on steps may vary, implementing a single calibration step 290, called primary calibration step, during a single calibration time range, an initial value, called primary value, of the second parameter being calculated during this primary calibration step 290, and comparing, via the first control module 25 or via the second control module 100, the primary value and the initial value calculated during the last calibration step 290 implemented before the turning off step, called stored value.

After the comparison step, one of the two following steps is carried out.

If a difference between the primary value and the stored value is less than or equal to a predetermined threshold, steps 200 to 250 are carried out according to the first exemplary method. The predetermined threshold is for example inclusively between 50% and 100%.

During the measuring step 240, each value of the first parameter is calculated based on the stored value. In a variant, each value of the first parameter is calculated based on the primary value.

If the difference is strictly greater than the threshold, a plurality of calibration steps 290 are successively implemented, as described in the second exemplary method. In particular, during the measuring step 240, each value of the first parameter is calculated from an average value of the calculated initial values.

This variant makes it possible to detect a significant variation of the value of the second parameter during a period of inactivity of the measuring device 10 via the primary calibration step 290.

If no significant variation is detected, it is considered that the second parameter is stable and that it is therefore not necessary to perform several calibrations 290 in order to precisely determine the second parameter. As a result, the device could immediately start a measurement, with the last stored value. The implementation of the method is therefore faster.

The invention claimed is:

1. A device for measuring a first parameter of a specimen, the device comprising a measuring volume configured to receive the specimen, a first control module and a measuring module, the first control module being configured to supply electricity to the measuring module with an electrical supply current,
the measuring module comprising a magnetic field generator, a sensor and a second control module, the magnetic field generator being configured to generate a magnetic excitation field in the measuring volume, the sensor being configured to measure values of a variable of the measuring volume during the generation of the magnetic excitation field, the second measuring control module being configured to calculate a value of the first parameter based on at least one value of the variable,
wherein the first control module is configured to, following the generation of the magnetic excitation field, inhibit the power supply of the measuring module during a first predetermined length of time, and
wherein the magnetic excitation field comprises at least two first frequency components, each frequency component having a first frequency separate from the first frequency of the other frequency component, the sensor being configured to measure values of a second frequency component of the variable, the second frequency component having a second frequency, the second frequency component being equal to the sum of two products, each product being the product of one of the two first frequencies and an integer different from zero.

2. The device according to claim 1, wherein the variable is an intensity of the magnetic field in the measuring volume.

3. The device according to claim 1, wherein the first length of time is inclusively between 4 minutes and 6 minutes.

4. The device according to claim 1, further including a detector able to detect the presence of a specimen in the measuring volume, the first control module being configured to, following the detection of the presence of a specimen in the measuring volume, supply electricity to the measuring module at the end of a second predetermined length of time, the supply being inhibited as long as a third length of time, measured from the last generation of a magnetic excitation field by the measuring device, is less than or equal to the first length of time.

5. The device according to claim 1, wherein the first control module is configured, when no specimen is present in the measuring volume, to supply electricity to the measuring module during a series of time ranges, the generator generating the magnetic excitation field during each time range, the time ranges being repeated periodically with a predetermined time period greater than or equal to the first duration, the second control module being configured to calculate, for each time range, an initial value of a second parameter of the measurement volume from at least one value of the variable measured during the time range, the values of the first parameter being calculated based on at least one calculated initial value.

6. The device according to claim 5, further including an incubation chamber configured to receive the specimen and to keep the specimen at a predetermined temperature, the first control module being configured to:
detect an insertion of the specimen into the incubation chamber at an insertion instant,
estimate an end of incubation instant, after the insertion instant and separated from the insertion instant by a predetermined incubation duration, and
inhibit the supply of the measuring module during each time range prior to the end of incubation instant and separated from the end of incubation instant by a length of time less than or equal to the first duration.

7. A method for measuring a first parameter of a specimen, implemented by a measuring device including a measuring volume, a first control module and a measuring module, the measuring module including a magnetic field generator, a sensor and a second control module,
the method comprising:
supplying the measuring module with an electric supply current via the first control module,
generating, via the magnetic field generator, a magnetic excitation field in the measuring volume, the specimen being received in the measuring volume,
measuring, via the sensor when the magnetic excitation field is generated, values of a variable of the measuring volume, the measured values being transmitted to the second control module, and
calculating, via the second control module, a value of the first parameter based on at least one received value,
the method further comprising, after the implementation of generating, inhibiting, by the first control module, of the supply of the measuring module during a first predetermined length of time;
wherein the magnetic excitation field includes at least two first frequency components, each frequency component having a first frequency separate from the first frequency of the other frequency component, the sensor being configured to measure values of a second frequency component of the variable, the second frequency component having a second frequency, the second frequency component being equal to the sum of two products, each product being the product of one of the two first frequencies and an integer different from zero.

8. The method according to claim 7, wherein the variable is an intensity of the magnetic field in the measuring volume.

9. The method according to claim 7, further comprising:
when no specimen is present in the measuring volume, supplying electricity to the measuring module during a plurality of time ranges via the first control module, the time ranges being repeated periodically with a predetermined time period greater than or equal to the first duration,
generating the magnetic excitation field via the generator and measuring, via the sensor, at least one value of the variable during each time range, and
determining, via the second control module, for each time range, an initial value of a second parameter of the measuring volume from the value(s) of the variable measured during the time range,
each value of the first parameter being calculated by the second control module (100) based on at least one determined initial value.

10. The method according to claim 9, further comprising successively in this order:
storing each initial value in a memory of the measuring device,
turning off the measuring device,
turning on the measuring device,
for a single time range, after turning on the measuring device, generating the magnetic excitation field via the generator, measuring, via the sensor, at least one value of the variable during the time range, and determining, via the second control module, an initial value of a second parameter of the measuring volume from the value(s) of the variable measured during said time range,
comparing the initial value determined during the time range after turning on the measuring device and the initial value determined during the last determining implemented before turning off the measuring device, and
if a difference between the two compared initial values is less than or equal to a predetermined threshold, calculating at least one value of the first parameter based on one of the two compared initial values.

11. The method according to claim 10, wherein the first parameter is a concentration of elements-analytes in the specimen, the method comprising, prior to the generating, measuring and calculating, placing the specimen in contact with a set of superparamagnetic particles, each particle being able to attach to the elements-analytes.

* * * * *